United States Patent
Weaver et al.

(10) Patent No.: US 6,531,947 B1
(45) Date of Patent: Mar. 11, 2003

(54) DIRECT ACTING VERTICAL THERMAL ACTUATOR WITH CONTROLLED BENDING

(75) Inventors: Billy L. Weaver, Eagan, MN (US); Douglas P. Goetz, St. Paul, MN (US); Kathy L. Hagen, Stillwater, MN (US); Mike E. Hamerly, Vadnais Heights, MN (US); Robert G. Smith, Vadnais Heights, MN (US); Silva K. Theiss, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 82 days.

(21) Appl. No.: 09/659,798

(22) Filed: Sep. 12, 2000

(51) Int. Cl.[7] .................... H01H 61/04; H01H 61/01; H02N 10/00
(52) U.S. Cl. .................... 337/139; 337/123; 337/14; 60/528; 310/307; 361/163
(58) Field of Search .................... 337/12, 14, 123, 337/139–141, 339, 343, 298, 393; 60/527, 528, 529; 310/306–309; 361/163

(56) References Cited

U.S. PATENT DOCUMENTS

| | | |
|---|---|---|
| 4,423,401 A | 12/1983 | Mueller |
| 4,679,908 A | 7/1987 | Goodwin |
| 4,688,885 A | 8/1987 | Poteat et al. |
| 5,024,500 A | 6/1991 | Stanley et al. |
| 5,182,910 A | 2/1993 | Beneck |
| 5,206,557 A | 4/1993 | Bobbio |
| 5,290,400 A | 3/1994 | Bobbio |
| 5,351,412 A | 10/1994 | Furuhata et al. |
| 5,401,983 A | 3/1995 | Jokerst et al. |
| 5,418,418 A | 5/1995 | Hirano et al. |
| 5,489,812 A | 2/1996 | Furuhata et al. |
| 5,506,175 A | 4/1996 | Zhang et al. |
| 5,536,988 A | 7/1996 | Zhang et al. |
| 5,602,955 A | 2/1997 | Haake |
| 5,685,062 A | 11/1997 | McCarthy et al. |
| 5,719,073 A | 2/1998 | Shaw et al |
| 5,726,480 A | * 3/1998 | Pister .................... 257/415 |
| 5,846,849 A | 12/1998 | Shaw et al. . |

(List continued on next page.)

FOREIGN PATENT DOCUMENTS

| | | | |
|---|---|---|---|
| EP | 0 672 931 A1 | 9/1995 | |
| EP | 0 713 117 A1 | 5/1996 | |
| EP | 0 961 150 A2 | 1/1999 | |
| EP | 0 924 763 A2 | 6/1999 | |
| EP | 0 986 106 A1 | 3/2000 | |
| JP | 2001-138298 A | * 5/2002 | ............. B81B/3/00 |
| WO | 89/09477 | 5/1989 | |
| WO | 93/21663 | 10/1993 | |
| WO | 96/34417 | 10/1996 | |

OTHER PUBLICATIONS

The Realization and Design Considerations of a Flip–Chip Integrated MEMS Tunable Capacitor, Kevin F. Harsh, et al., Sensors and Actuators 80 (2000) p. 108–118.*

(List continued on next page.)

*Primary Examiner*—Anatoly Vortman
(74) *Attorney, Agent, or Firm*—Scott A. Bardell

(57) ABSTRACT

A micrometer sized, single-stage, vertical thermal actuator with controlled bending capable of repeatable and rapid movement of a micrometer-sized optical device off the surface of a substrate. The vertical thermal actuator is constructed on a surface of a substrate. At least one hot arm has a first end anchored to the surface and a free end located above the surface. A cold arm has a first end anchored to the surface and a free end. The cold arm is located above the hot arm relative to the surface. The cold arm is adapted to provide controlled bending near the first end thereof. A member mechanically and electrically couples the free ends of the hot and cold arms such that the actuator bends generally at the flexure so that the member moves away from the substrate when current is applied to at least the hot arm.

52 Claims, 6 Drawing Sheets

U.S. PATENT DOCUMENTS

| | | | |
|---|---|---|---|
| 5,847,454 A | | 12/1998 | Shaw et al. |
| 5,880,921 A | * | 3/1999 | Tham et al. .................. 333/262 |
| 5,912,094 A | | 6/1999 | Aksyuk et al. |
| 5,955,817 A | * | 9/1999 | Dhuler et al. ................ 310/307 |
| 5,959,376 A | | 9/1999 | Allen |
| 5,960,132 A | | 9/1999 | Lin |
| 5,962,949 A | * | 10/1999 | Dhuler et al. ................ 310/307 |
| 5,963,367 A | | 10/1999 | Aksyuk et al. |
| 5,994,159 A | | 11/1999 | Aksyuk et al. |
| 5,995,688 A | | 11/1999 | Aksyuk et al. |
| 6,014,240 A | | 1/2000 | Floyd et al. |
| 6,067,797 A | | 5/2000 | Silverbrook |
| 6,070,656 A | | 6/2000 | Dickey |
| 6,236,300 B1 | * | 5/2001 | Minners ...................... 148/402 |
| 6,275,325 B1 | | 8/2001 | Sinclair |

OTHER PUBLICATIONS

Cowen et al., "Vertical Thermal Actuators for Micro–Opto–Electro–Mechanical Systems", 3226 SPIE, pp. 137–146 (1997).

Harsh et al., "The Realization and Design Considerations of a Flip–Chip Intergrated MEMS Tunabel Capacitor", 80 Sensors and Actuators, pp. 108–118 (2000).

Harsh et al., "Flip–Chip Assembly for SI–Based RF MEMS", IEEE Conference on Micromechanical Systems, 35 pp. 273–278 (1999).

Feng et al., "MEMS–Based Variable Capacitor for Millimeter–Wave Applications", Soild State Sensor and Actuator Workshop, pp. 255–258 (2000).

Noworolski et al., "Process for In–Plane and Out–of–Plane Single–Crystal–Silicon Thermal Microactuators", 55 Sensors and Actuators, pp. 65–69 (1996).

Riethmuller et al., "Thermally Excited Silicon Microactuators", 3 IEEE Transactions on Electron Devices, pp. 758–763 (1988).

Thielicle et al., "Microactuators and Their Technologies", 10 Mechatronics, pp. 431–455 (2000).

Burns et al., Design and Performance of a Double Hot Arm Polysilicon Thermal Actuator, 3224 SPIE, pp. 296–306 (1997).

Read et al., "Mechanical and Optical Characterization of Thermal Microactuators Fabricated in a CMOS Process", 2642 SPIE, pp. 22–32 (1995).

Comtois et al., "Thermal Microactuators for Surface–Micromachining Processes", 2642 SPIE, pp. 10–21 (1995).

Comtois et al., "Characterization of Electrothermal Actuators and Arrays fabricated in a Four–level, Planarized Surface–Micromachined and Polycrystalline Silicon Process", Intl' Conf. On Solid–State Sensors and Actuators, pp. 679–772 (1997).

Reid et al., "Automated Assembly of Flip–Up Micromirrors". 66 Sensors and Actuators, pp. 292–298 (1998).

Toshiyoshi et al., "Electromagnetic Torsion Mirrors for Self–Aligned Fiber–optic Crossconnectors by Micromachining", 5 IEEE Journal of Selected Topics in Quantum Mechanics, pp. 10–17 (1999).

Thielicke et al., "Microactuators and their Technologies", 10 Mechatronics, pp. 431–455 (2000).

Chiou et al., "A Micromirror Device with Tilt and Piston Motions", 3893 SPIE, pp. 298–303 (1999).

Aksyuk et al., "Stress–Induced Curvature Engineering in Surface–Micromachined Devices", 3680 SPIE, pp. 984–993 (1999).

Koester et al., "MUMPS ©Design Handbook", Revision 5.0 Cronos Integrated Microsystems, pp. 1–38 (2000).

* cited by examiner

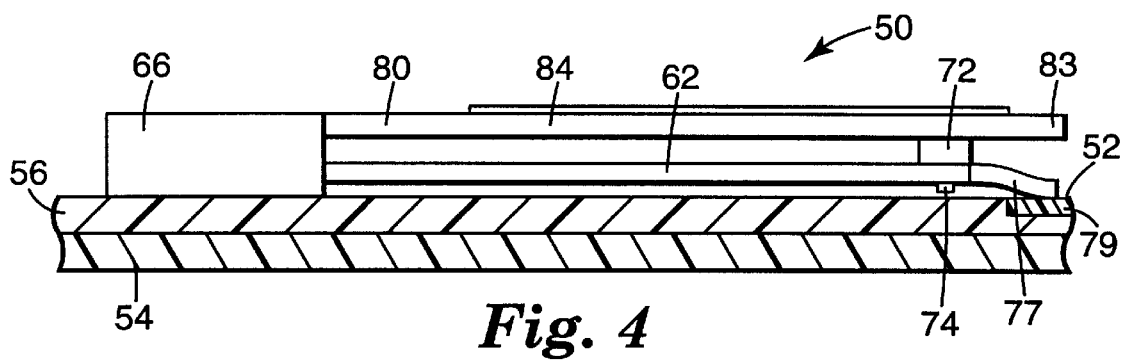
*Fig. 4*
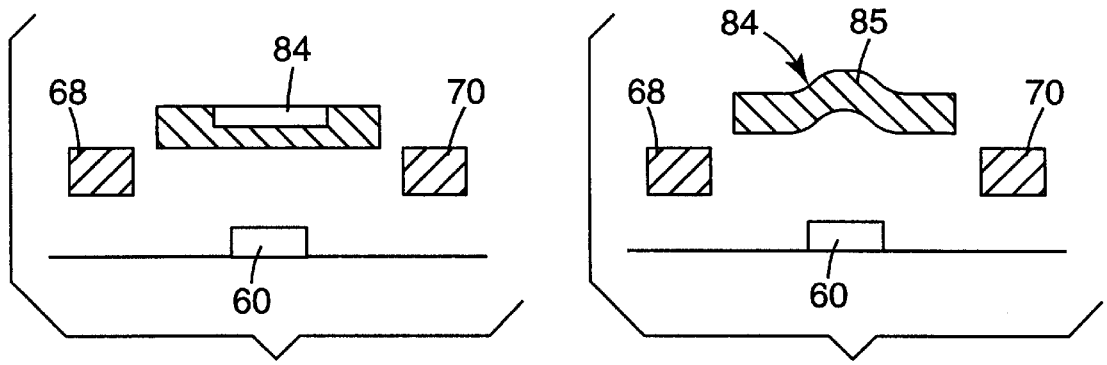
*Fig. 5*  *Fig. 6*
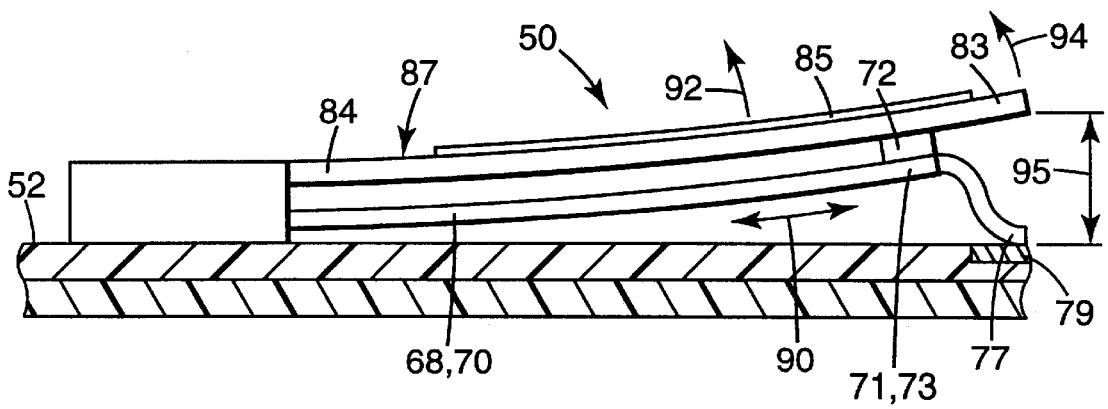
*Fig. 7*

DIRECT ACTING VERTICAL THERMAL ACTUATOR WITH CONTROLLED BENDING

FIELD OF THE INVENTION

The present invention relates generally to micromechanical devices, and more particularly, to a micrometer sized vertical thermal actuator with controlled bending that is capable of repeatable and rapid movement of a micrometer-sized device off the surface of a substrate.

BACKGROUND OF THE INVENTION

Fabricating complex micro-electro-mechanical systems (MEMS) and micro-optical-electro-mechanical systems (MOEMS) devices represents a significant advance in micro-mechanical device technology. Presently, micrometer-sized analogs of many macro-scale devices have been made, such as for example hinges, shutters, lenses, mirrors, switches, polarizing devices, and actuators. These devices can be fabricated, for example, using Multi-user MEMS processing (MUMPs) available from Cronos Integrated Microsystems located at Research Triangle Park, North Carolina. Applications of MEMS and MOEMS devices include, for example, data storage devices, laser scanners, printer heads, magnetic heads, micro-spectrometers, accelerometers, scanning-probe microscopes, near-field optical microscopes, optical scanners, optical modulators, micro-lenses, optical switches, and micro-robotics.

One method of forming a MEMS or MOEMS device involves patterning the device in appropriate locations on a substrate. As patterned, the device lies flat on top of the substrate. For example, the hinge plates of a hinge structure or a reflector device are both formed generally coplanar with the surface of the substrate using the MUMPs process. One challenge to making use of these devices is moving them out of the plane of the substrate.

Coupling actuators with micro-mechanical devices allows for moving these devices out of the plane of the substrate. Various types of actuators, including electrostatic, piezoelectric, thermal and magnetic have been used for this purpose.

One such actuator is described by Cowan et al. in "Vertical Thermal Actuator for Micro-Opto-Electro-Mechanical Systems", v.3226, SPIE, pp. 137–46 (1997). The actuator 20 of Cowan et al. illustrated in FIG. 1 uses resistive heating to induce thermal expansion. The hot arm 22 is higher than the cantilever arm 24, so that thermal expansion drives the actuator tip 26 toward the surface of the substrate 28. At sufficiently high current, the downward deflection of the actuator tip 26 is stopped by contact with the substrate 28 and the hot arms 22 bow upward. Upon removal of the drive current the hot arms 22 rapidly "freeze" in the bowed shape and shrink, pulling the actuator tip 26 upward, as illustrated in FIG. 2.

The deformation of the hot arm 22 is permanent and the actuator tip 26 remains deflected upward without applied power, forming a backbent actuator 32. Further application of the drive current causes the backbent actuator 32 to rotate in the direction 30 toward the surface of the substrate 28. The backbent actuator 32 of FIG. 2 is typically used for setup or one-time positioning applications. The actuators described in Cowan et al. are limited in that they cannot rotate or lift hinged plates substantially more than forty-five degrees out-of-plane in a single actuation step.

Harsh et al., "Flip Chip Assembly for Si-Based Rf MEMS" Technical Digest of the Twelfth IEEE International Conference on Micro Electro Mechanical Systems, IEEE Microwave Theory and Techniques Society 1999, at 273–278; Harsh et al., "The Realization and Design Considerations of a Flip-Chip Integrated MEMS Tunable Capacitor" 80 Sensors and Actuators 108–118 (2000); and Feng et al., "MEMS-Based Variable Capacitor for Millimeter-Wave Applications" Solid-State Sensor and Actuator Workshop, Hilton Head Island, S.C. 2000, at 255–258 disclose various vertical actuators based upon a flip-chip design. During the normal release etching step, the base oxide layer is partially dissolved and the remaining MEMS components are released. A ceramic substrate is then bonded to the exposed surface of the MEMS device and the base polysilicon layer is removed by completing the etch of the base oxide layer (i.e., a flip chip process). The resultant device, which is completely free of the polysilicon substrate, is a capacitor in which the top plate of the capacitor is controllably moved in a downward fashion toward an opposing plate on the ceramic substrate. The device is removed from the polysilicon substrate because stray capacitance effects of a polysilicon layer would at a minimum interfere with the operation of the device.

Lift angles substantially greater than forty-five degrees are achievable with a dual-stage actuator system. A dual-stage actuator system typically consists of a vertical actuator and a motor. The vertical actuator lifts the hinged micro-mechanical device off of the substrate to a maximum angle not substantially greater than forty-five degrees. The motor, which has a drive arm connected to a lift arm of the micro-mechanical device, completes the lift. One such dual-stage assembly system is disclosed by Reid et al. in "Automated Assembly of Flip-Up Micromirrors", Transducers '97, Int'l Conf. Solid-State Sensors and Actuators, pp. 347–50 (1997). These dual stage actuators are typically used for setup or one-time positioning applications.

The dual-stage actuator systems are complex, decreasing reliability and increasing the cost of chips containing MEMS and MOEMS devices. As such, there is a need for a micrometer sized vertical thermal actuator with controlled bending that is capable of repeatable and rapid movement of a micrometer-sized device off the surface of the substrate.

BRIEF SUMMARY OF THE INVENTION

The present invention is directed to a micrometer sized vertical thermal actuator with controlled bending capable of repeatable and rapid movement of a micrometer-sized optical device off the surface of the substrate. Controlled bending maximizes the displacement of the present vertical thermal actuator.

The vertical thermal actuator is constructed on a surface of a substrate. At least one hot arm has a first end anchored to the surface and a free end located above the surface. A cold arm has a first end anchored to the surface and a free end. The cold arm is located above the hot arm relative to the surface. A flexure is formed in the cold arm near the first end thereof adapted to provide controlled bending. A member mechanically and electrically couples the free ends of the hot and cold arms such that the actuator bends generally at the flexure so that the member moves away from the substrate when current is applied to the at least the hot arm.

The flexure comprises at least one of a recess, depression, cut-out, hole, location of narrowed, thinned or weakened material, alternate material or other structural features or material change that decreases resistance to bending in that location. In one embodiment, the hot arm and the cold arm comprise a circuit through which electric current is passed.

In another embodiment, a grounding tab electrically couples the hot arm to the substrate. In the embodiment with the grounding tab, the cold arm can optionally be electrically isolated from the hot arm.

In one embodiment, a reinforcing member is formed in the cold arm. The reinforcing member typically extends from proximate the flexure to proximate the free end thereof. The reinforcing member can be integrally formed in the cold arm. In one embodiment, the reinforcing member extends longitudinally along the cold arm, such as one or more ridges extending longitudinally along the cold arm.

In one embodiment, the reinforcing member is located directly above the hot arm. The cold arm can be located directly over the hot arm. The first end of the hot arm can be attached to the substrate adjacent to the first end of the cold arm or offset from the first end of the cold arm. A metal layer optionally extends along the cold arm. In one embodiment, the at least one hot arm comprises two hot arms each having a first end anchored to the surface and free ends located above the surface.

In another embodiment, the vertical thermal actuator includes at least one hot arm with a first end anchored to the surface and a free end located above the surface. A cold arm has a first end anchored to the surface and a free end. The cold arm is located above the hot arm relative to the surface. A reinforcing member is formed in a first portion of the cold arm. A second portion of the cold beam without the reinforcing member is adapted to provide controlled bending of the vertical thermal actuator. A member mechanically and electrically couples the free ends of the hot and cold arms such that the member moves away from the substrate when current is applied to at least the hot arm.

In another embodiment, the vertical thermal actuator has a first beam with a first end anchored to the surface and a free end located above the surface. A second beam has a first end anchored to the surface and a free end located above the surface. A member electrically and mechanically couples the free end of the first beam to the free end of the second beam. A third beam has a first end anchored to the surface and a free end mechanically coupled to the member. The third beam is located above the first and second beams relative to the surface. A flexure is formed in the third beam near the first end thereof adapted to provide controlled bending. First and second electrical contacts are electrically coupled to the first ends of the first and second beams, respectively, such that current supplied to the first and second contacts causes the first and second beams to thermally expand and the member to move in an arc away from the substrate.

In one embodiment, the third beam is located generally over the first and second beams. The third beam may optionally include a metal layer. The first and second beams are generally parallel to the first surface in an unactivated configuration. Electric current is applied to the first and second electric contacts in an activated configuration so that the first and second beams curved upward away from the surface of the substrate.

In one embodiment, the first end of the third beam is electrically isolated from the substrate. In another embodiment, at least a portion of the current in the first and second beams passes through the third beam. The first and second beams can optionally be electrically coupled to the substrate by a grounding tab.

In another embodiment, the vertical thermal actuator has a first beam with a first end anchored to the surface and a free end located above the surface. A second beam has a first end anchored to the surface and a free end located above the surface. A member electrically and mechanically couples the free end of the first beam to the free end of the second beam. A third beam has a first end anchored to the surface and a free end mechanically coupled to the member. The third beam is located above the first and second beams relative to the surface. A reinforcing member is formed along a first portion of the third beam. A second portion of the third beam without the reinforcing member is adapted to provide controlled bending of the vertical thermal actuator. First and second electrical contacts are electrically coupled to the first ends of the first and second beams, respectively, such that current supplied to the first and second contacts causes the first and second beams to thermally expand and the member to move in an arc away from the substrate.

A plurality of vertical thermal actuators can be formed on a single substrate. At least one optical device can be mechanically coupled to the vertical thermal actuator. The optical device comprises one of a reflector, a lens, a polarizer, a wave-guide, a shutter, or an occluding structure. The optical device can be part of an optical communication system.

BRIEF DESCRIPTION OF THE SEVERAL VIEWS OF THE DRAWING

Further features of the invention will become more apparent from the following detailed description of specific embodiments thereof when read in conjunction with the accompany drawings.

FIG. 4 is a side view of the vertical thermal actuator of FIG. 3.

FIG. 5 is a sectional view of the vertical thermal actuator of FIG. 3.

FIG. 6 is a sectional view of the vertical thermal actuator of FIG. 3.

FIG. 7 is a side view of the vertical thermal actuator of FIG. 4 in an actuated position.

DETAILED DESCRIPTION OF THE INVENTION

Figure 1:
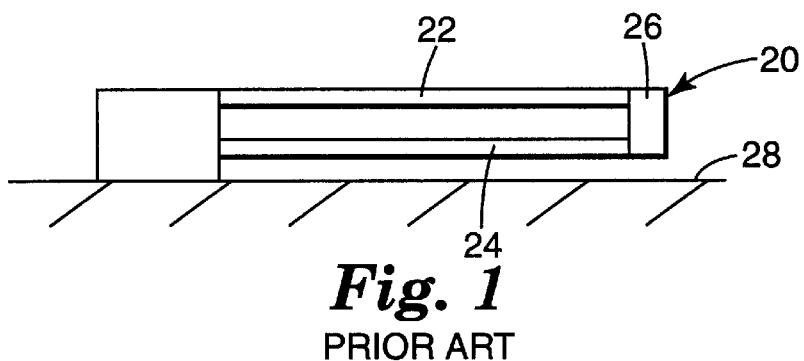
FIG. 1 is a side view of a vertical thermal actuator prior to backbending.
Figure 2:
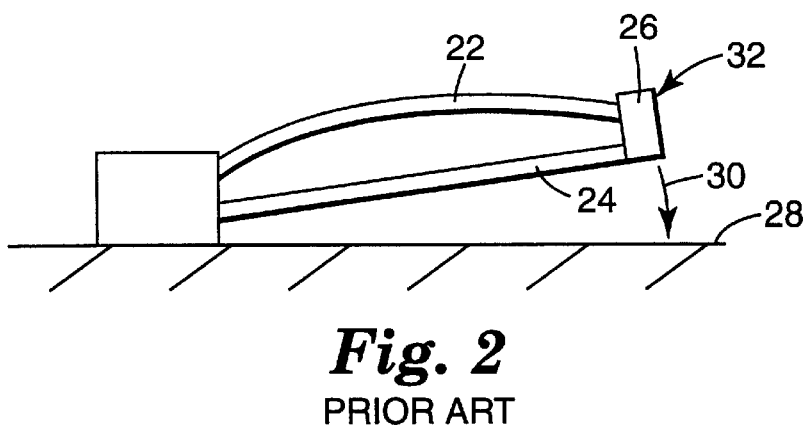
FIG. 2 is a side view of the vertical thermal actuator of FIG. 1 after backbending.

The present invention relates to a single-stage, vertical thermal actuator with controlled bending for micro-mechanical devices. As used herein, "controlled bending" refers to bending that occurs primarily at a discrete location, rather than being distributed along the beams of the vertical thermal actuator. The micrometer sized vertical thermal actuator is capable of repeatable and rapid movement out of plane.

As used herein, "micro-mechanical device" refers to micrometer-sized mechanical, opto-mechanical, electromechanical, or opto-electro-mechanical device. Various technology for fabricating micro-mechanical devices is available using the Multi-User MEMS Processes (MUMPs) from Cronos Integrated Microsystems located at Research Triangle Park, North Carolina. One description of the assembly procedure is described in "MUMPs Design Handbook," revision 5.0 (2000) available from Cronos Integrated Microsystems.

Polysilicon surface micromachining adapts planar fabrication process steps known to the integrated circuit (IC) industry to manufacture micro-electro-mechanical or micro-mechanical devices. The standard building-block processes for polysilicon surface micromachining are deposition and photolithographic patterning of alternate layers of low-stress polycrystalline silicon (also referred to as polysilicon) and a sacrificial material (e.g. silicon dioxide or a silicate glass). Vias etched through the sacrificial layers at predetermined locations provide anchor points to a substrate and mechanical and electrical interconnections between the polysilicon layers. Functional elements of the device are built up layer by layer using a series of deposition and patterning process steps. After the device structure is completed, it can be released for movement by removing the sacrificial material using a selective etchant such as hydrofluoric acid (HF) which does not substantially attack the polysilicon layers.

The result is a construction system generally consisting of a first layer of polysilicon which provides electrical interconnections and/or a voltage reference plane, and additional layers of mechanical polysilicon which can be used to form functional elements ranging from simple cantilevered beams to complex electromechanical systems. The entire structure is located in-plane with the substrate. As used herein, the term "in-plane" refers to a configuration generally parallel to the surface of the substrate and the terms "out-of-plane" refer to a configuration greater than zero degrees to about ninety degrees relative to the surface of the substrate.

Typical in-plane lateral dimensions of the functional elements can range from one micrometer to several hundred micrometers, while the layer thicknesses are typically about 1–2 micrometers. Because the entire process is based on standard IC fabrication technology, a large number of fully assembled devices can be batch-fabricated on a silicon substrate without any need for piece-part assembly.

FIGS. 3 through 6 illustrate a first embodiment of a vertical thermal actuator 50 with controlled bending in accordance with the present invention. As used herein, "vertical thermal actuator" refers to a micro-mechanical device capable of repeatably moving an optical device between an in-plane position and an out-of-plane position. The vertical thermal actuator 50 is disposed in-plane on a surface of a substrate 52 typically comprising a silicon wafer 54 with a layer of silicon nitride 56 deposited thereon. The actuator 50 includes a first layer 60 of polysilicon located on the layer of silicon nitride 56. As best seen in FIG. 6, the first layer 60 comprises a bump that forms the reinforcing member 85 in the cold beam 84. A second layer of polysilicon 62 is configured to have first and second anchors 64, 66 and a pair of beams 68, 70 arranged in a cantilever fashion from the anchors 64, 66 respectively.

Figure 3:
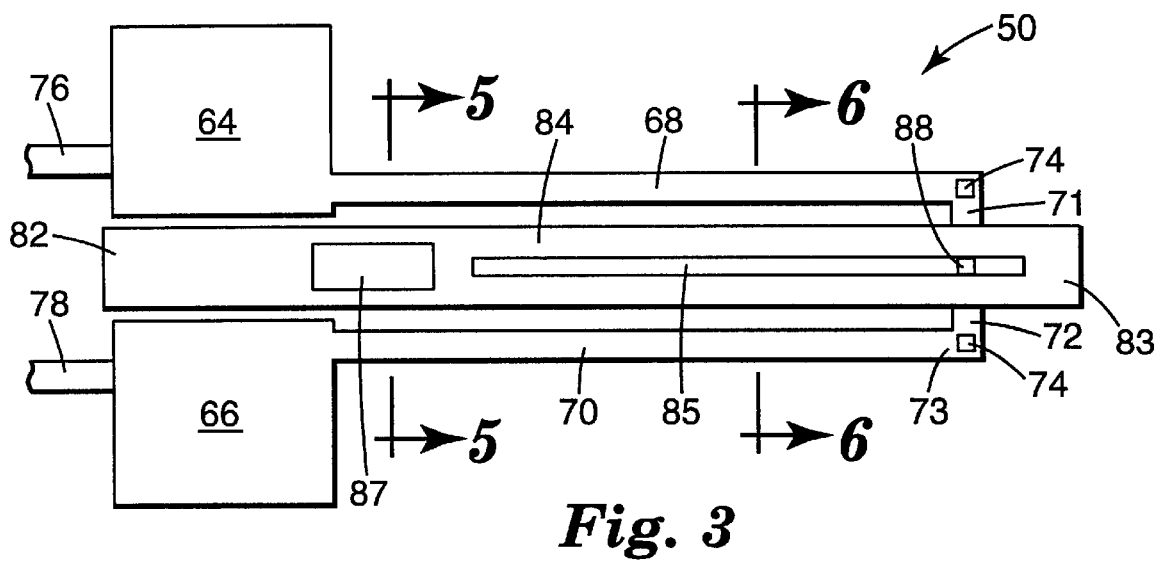
FIG. 3 is a top view of a vertical thermal actuator with controlled bending in accordance with the present invention.

In the embodiment illustrated in FIG. 3, the anchors 64, 66 include electrical contacts 76, 78 formed on the substrate 52 adapted to carry electric current to the beams 68, 70. The traces 76, 78 typically extend to the edge of the substrate 52. Alternatively, a wide variety of electric contact devices and/or packaging methods such as a ball grid array (BGA), land grid array (LGA), plastic leaded chip carrier (PLCC), pin grid array (PGA), edge card, small outline integrated circuit (SOIC), dual in-line package (DIP), quad flat package (QFP), leadless chip carrier (LCC), chip scale package (CSP) can be used to deliver electric current to the beams 68, 70.

The beams 68, 70 are electrically and mechanically coupled at their respective free ends 71, 73 by member 72 to form an electric circuit. In an alternate embodiment, beams 68, 70 are electrically coupled to grounding tab 77. The grounding tab 77 electrically couples the beams 68, 70 to contact 79 on the substrate 52 in both the unactivated configuration (see FIG. 4) and the activated configuration (see FIG. 7). The grounding tab 77 can be a flexible member or a spring member that is adapted to maintain contact with the contact 79. A grounding tab can be used with any of the embodiments disclosed herein.

The beams 68, 70 are physically separated from the first layer 60 so that the member 72 is located above the substrate 52. One or more dimples 74 may optionally be formed in the member 72 to support the beams 68, 70 above the substrate 52. In an alternate embodiment, the dimples or bumps 74 can be formed on the substrate 52. In an unactivated configuration illustrated in FIG. 4, the beams 68, 70 are generally parallel to the surface of the substrate 52. As used herein, the "unactivated configuration" refers to a condition in which substantially no current is passed through the circuit formed by the beam 68, the member 72 and the beam 70.

A third layer 80 of polysilicon is configured with an anchor 82 attached to the substrate 52 near the anchor 64, 66. The third layer 80 forms upper beam 84 cantilevered from the anchor 82 with a free end 83 mechanically coupled to the member 72 above the beams 68, 70. In the illustrated embodiment, reinforcing member 85 is formed in the upper beam 84 along at least a portion of its length and flexure 87 is formed in the upper beam 84 near the anchor 82. In one embodiment, a metal layer is optionally applied to the upper beam 84.

As used herein, "reinforcing member" refers to one or more ridges, bumps, grooves or other structural features that increase resistance to bending. The reinforcing members are preferably formed during the MUMPs process so that it is integrally formed with the upper beam 84. In the illustrated embodiment, the reinforcing member 85 is a curvilinear ridge (see FIG. 6) extending along a portion of the upper beam 84, although it could be rectangular, square, triangular or a variety of other shapes. Additionally, the reinforcing member 85 can be located in the center of the upper beam 84 or along the edges thereof Multiple reinforcing members (see FIG. 16) may also be used.

Figure 9:
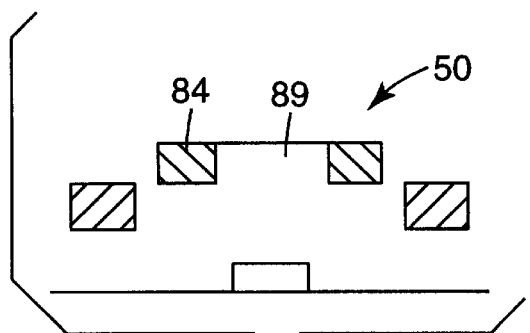
FIG. 9 is a sectional view of an alternate flexure for a vertical thermal actuator in accordance with the present invention.
Figure 10:
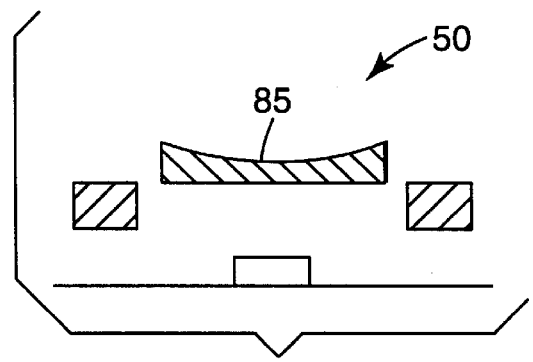
FIG. 10 is a sectional view of another alternate flexure for a vertical thermal actuator in accordance with the present invention.

As used herein, "flexure" refers to a recess, depression, hole, slot, cut-out, location of narrowed, thinned or weakened material, alternate material or other structural features or material change that provides controlled bending in a particular location. Alternate materials suitable for use as a flexure include polysilicon, metal or polymeric material. As best illustrated in FIGS. 3 and 5, the flexure 87 is a recess 89. The recess 89 comprises the weakest section of the upper beam 84, and hence, the location most likely to bend during actuation of the vertical thermal actuator 50. Alternate cross-sections for the flexure 87 are illustrated in FIGS. 9 and 10.

The rigidity of the upper beam 84 relative to the rigidity of the flexure 87 determines to a large extent the magnitude (location and direction) of the controlled bending of the vertical thermal actuator 50. In one embodiment, the reinforcing member 85 is used in combination with the flexure 87. In another embodiment, the reinforcing member 85 extends along a portion of the upper beam 84, but no flexure is used. The portion of the upper beam 84 without the reinforcing member 85 is the location of controlled bending. In yet another alternate embodiment, the flexure 87 is formed in the beam 84 without the reinforcing member 85 such that the flexure 87 is the location of controlled bending.

A via 88 is formed at the member 72 and/or free end 83 to mechanically couple the free end 83 of the upper beam 84 to the member 72. Other structures may be used to mechanically couple the upper beam 84 to the member 72. The upper beam 84 is generally parallel to surface of the substrate 52 in the unactivated configuration.

FIG. 7 is a side sectional view of the vertical thermal actuator 50 of FIGS. 3–6 in an out-of-plane or activated configuration. The "activated configuration" refers to applying electrical current to one or more of the beams. In the illustrated embodiment, electric current is applied to the circuit formed by the beam 68, the member 72, and the beam 70 (see FIG. 3). The beams 68, 70 are the "hot arms" and the beam 84 is the cold arm. As used herein, "hot arm" or "hot arms" refer to beams or members that have a higher current density than the cold arm(s) when a voltage is applied. "Cold arm" or "cold arms" refer to beams or members that have a lower current density than the hot arm(s) when a voltage is applied. In some embodiments, the cold arm(s) has a current density of zero. Consequently, the hot arms have greater thermal expansion than the cold arms.

The electric current heats the hot arms 68, 70 and causes them to increase in length in the direction 90. Expansion of the beams 68, 70 causes the free ends 71, 73 of the vertical thermal actuator 50 to move in an upward arc 92, generating lifting force 94 and displacement 95. The cold arm 84, however, is fixed at the anchor 82 and electrically isolated so that the current entirely or substantially passes through the circuit formed by the hot arms 68, 70 and the member 72.

Due to the height difference between the cold arm 84 and the hot arms 68, 70, a moment is exerted on the cold arm 84 near the anchor 82. The cold arm 84 bends near the flexure 87, resulting in greater displacement near the free end 83 than would occur without the flexure 87. The hot arms 68, 70 also bend easily, offering little resistance to the motion 92 of the cold arm 84. The reinforcing member 85 resists bending along the cold arm 84 that would normally occur near the member 72 when a load is placed at the free end 83.

In the illustrated embodiment, the displacement 95 can be from about 0.5 micrometers to about 4 micrometers. When the current is terminated, the vertical thermal actuator 50 returns to its original, unactivated configuration illustrated in FIG. 4.

In an alternate embodiment, the anchor 82 and the cold arm 84 are electrically coupled to the member 72. At least a portion of the current flowing through the hot arms 68, 70 flows along the cold arm 84 to the anchor 82. It is also possible that all of the current flowing through the hot arms 68, 70 exits the vertical thermal actuator 50 through the cold arm 84. The material and/or geometry of the cold arm 84 is adapted to have a lower current density than the hot arms 68, 70, even when the same voltage is applied. In one embodiment, the cold arm 84 is formed from a material with a coefficient of linear thermal expansion less than the coefficient of linear thermal expansion of the hot arms 68, 70. In yet another embodiment, the cold arm 84 is provided with a lower electrical resistivity by having a larger cross sectional area. In another embodiment, a conductive layer is provided on the cold arm 84. Suitable conductive materials include metals such as aluminum, copper, tungsten, gold, or silver, semiconductors, and doped organic conductive polymers such as polyacetylene, polyaniline, polypyrrole, polythiophene, polyEDOT and derivatives or combinations thereof. Consequently, the net expansion of the hot arms 68, 70 is greater than the expansion of the cold arm 84.

In another alternate embodiment, all or a portion of the current flowing through the hot arms 68, 70 flows through grounding tab 77 to the contact 79 on the substrate 52. The grounding tab 77 maintains electrical and physical contact with the contact 79 as the vertical thermal actuator 50 moves from the unactivated position to the activated position illustrated in FIG. 7.

Figure 8:
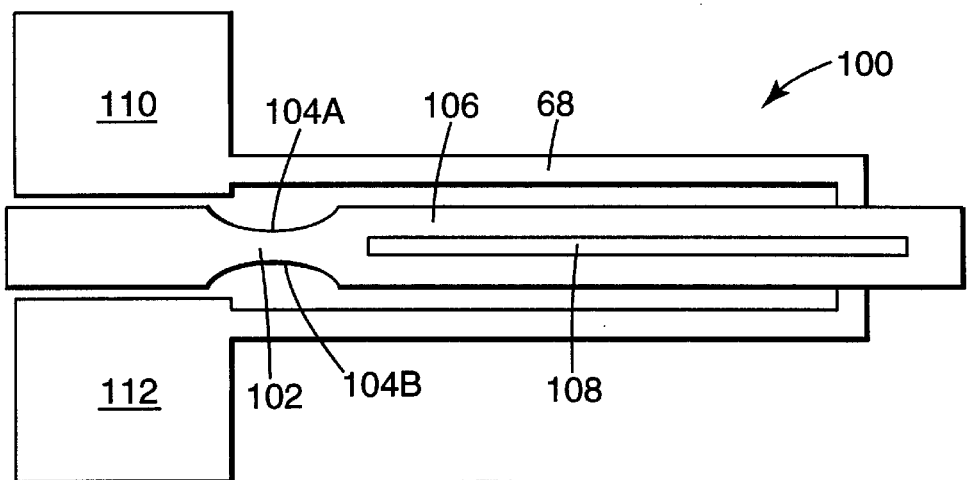
FIG. 8 is a top view of an alternate flexure for a vertical thermal actuator in accordance with the present invention.

FIG. 8 is a top view of a vertical thermal actuator 100 with an alternate flexure 102 in accordance with the present invention. The flexure 102 includes cut-outs 104A, 104B that narrow the cold arm or beam 106 in the region between the reinforcing member 108 and the anchors 110, 112. The cut-outs 104A, 104B may be symmetrical or asymmetrical. The cut-outs 104A and 104B can also be combined with any of the other structural features or material changes disclosed herein that decrease resistance to bending, including for example recesses, holes, slots, depressions, thinned or weakened material.

FIG. 9 is an alternate cross section of the vertical thermal actuator 50 of FIG. 3 in which the recess 89 extends completely through the cold arm or upper beam 84. The length, width and symmetry of the recess 89 can vary with the application.

FIG. 10 is another alternate cross section of the vertical thermal actuator 50 of FIG. 3 in which the recess 89 is curved. The curve can be symmetrical or asymmetrical, regular or irregular.

Figure 11:
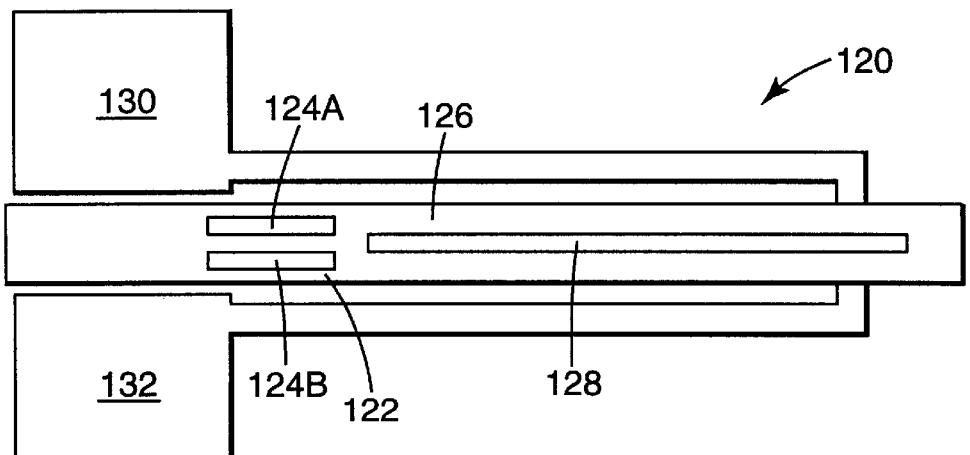
FIG. 11 is a top view of an alternate flexure for a vertical thermal actuator in accordance with the present invention.

FIG. 11 is a top view of a vertical thermal actuator 120 with an alternate flexure 122 in accordance with the present invention. The flexure 122 includes two parallel cut-outs 124A, 124B in the cold arm or beam 126 in the region between the reinforcing member 128 and the anchors 130, 132. The length, width, spacing and other features of the cut-outs 124A, 124B can vary with the application. The cut-outs 124A, 124B can also be combined with any of the other structural features or material changes disclosed herein that decrease resistance to bending, including for example recesses, holes, slots, depressions, cut-outs, locations of narrowed, thinned or weakened material.

Figure 12:
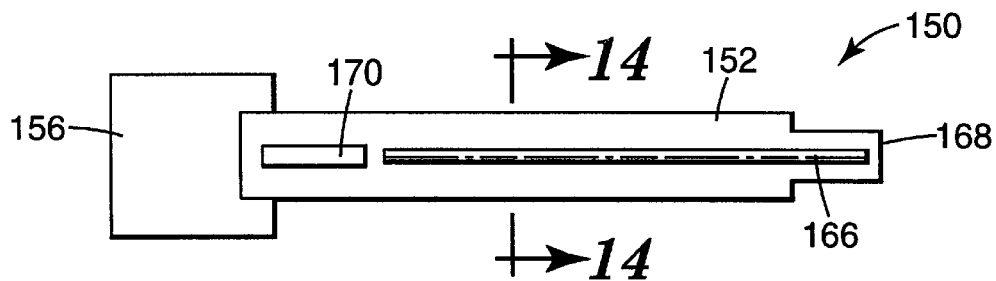
FIG. 12 is a top view of a two-beam vertical thermal actuator in accordance with the present invention.
Figure 13:
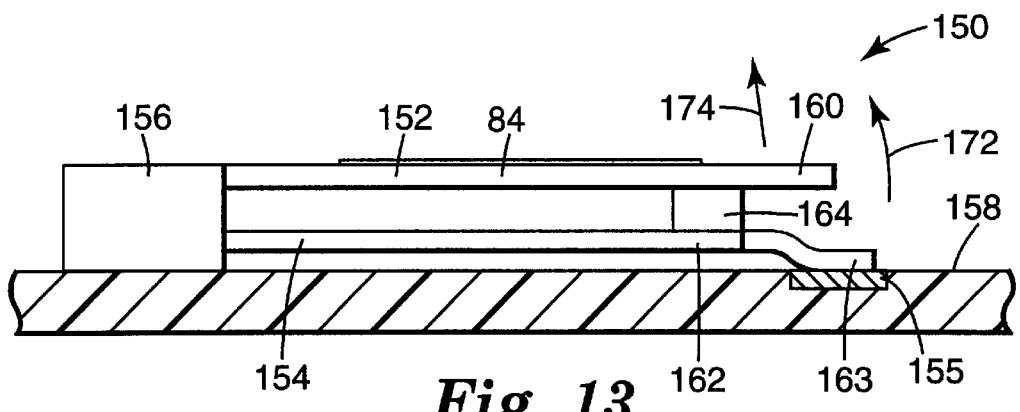
FIG. 13 is a side view of the vertical thermal actuator of FIG. 12.
Figure 14:
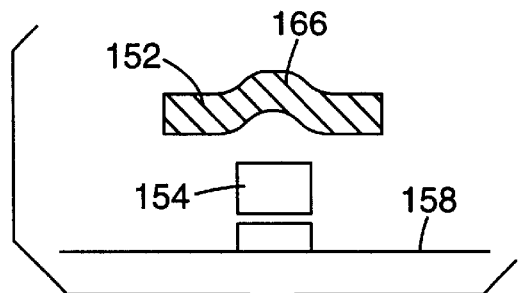
FIG. 14 is a sectional view of the vertical thermal actuator of FIG. 12.

FIGS. 12 through 14 illustrate a vertical thermal actuator 150 with two beams 152, 154 in accordance with the present invention. The cold arm or beam 152 extends from anchor 156 in a cantilever fashion above the hot arm or beam 154 and the substrate 158. The hot arm 154 optionally extends from the anchor 156 or from a separate anchor (see FIG. 15). Free ends 160, 162 of the beams 152, 154, respectively, are mechanically and electrically coupled at member 164. Reinforcing member 166 extends along the cold arm 152 from distal end 168 to flexure 170. Any of the flexures and reinforcing members disclosed herein can be used in the vertical thermal actuator 150. As best seen in FIG. 14, the hot arm 154 is located under the cold arm 152 to increase the stiffness of the cold arm 152.

In one embodiment, the cold arm 152, the member 164 and the hot arm 154 form a circuit. The material and/or geometry of the cold arm 152 is controlled so that it experiences a lower current density than the hot arm 154 when a voltage is applied to the circuit, as discussed above. In one embodiment, the cold arm 152 is formed from a material with a coefficient of linear thermal expansion less than the coefficient of linear thermal expansion of the hot arm 154. In yet another embodiment, the cold arm 152 is provided with a lower electrical resistivity by having a larger cross sectional area and/or a conductive layer. Consequently, the net expansion of the hot arm 154 is greater than the expansion of the cold arm 152. When current is applied to the circuit formed by the beams 152, 154, and the member 164, the vertical thermal actuator 150 curves upward in direction 172 and generates lifting force 174.

In another embodiment, a grounding tab 163 electrically couples the hot arm 154 to the contact 155 on the substrate 158. The grounding tab 163 is preferably flexible or a spring member so that its electrical coupling with the substrate 158 is maintained in the activated state (see generally FIG. 7). Consequently, less current (or no current) flows through the cold arm 152, thereby increasing the total displacement of the vertical thermal actuator 150.

Figure 15:
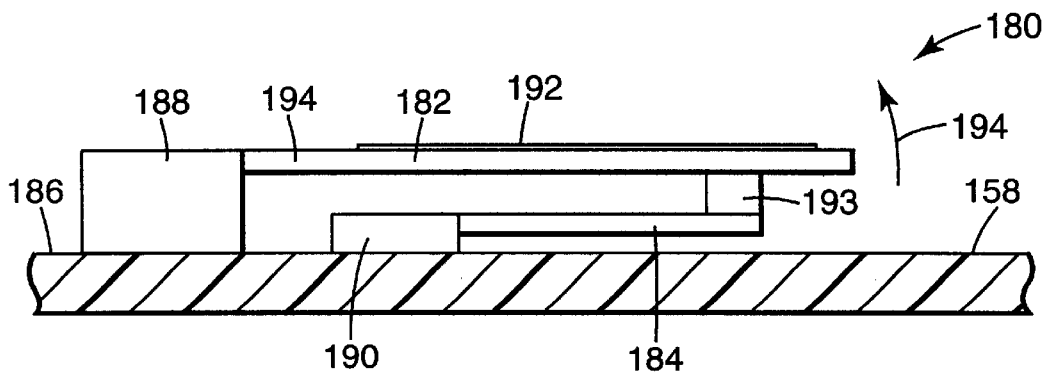
FIG. 15 is a side view of a two-beam vertical thermal actuator in accordance with the present invention.

FIG. 15 is a side view of a vertical thermal actuator 180 with cold arm or beam 182 located generally above hot arm or beam 184, such as illustrated in FIG. 14. The cold arm 182 is attached to substrate 186 by anchor 188. Reinforcing member 192 is located on the cold arm 182. A flexure 194 is located on the cold arm 182 near the anchor 188. Any of the reinforcing structures or flexures disclosed herein may be used in the embodiment of FIG. 15.

The hot arm 184 is attached to substrate 186 by anchor 190. In one embodiment, the beams 182, 184 are electrically and mechanically coupled at member 193. By locating the anchor 188 further from the member 193 than the anchor 190, the vertical thermal actuator 180 of FIG. 15 is capable of greater displacement in the direction 194, but generates a lower lifting force. In an alternate embodiment, the hot arm 184 can be electrically coupled to a contact on the substrate by a grounding tab such as discussed in connection with FIG. 13.

Figure 16:
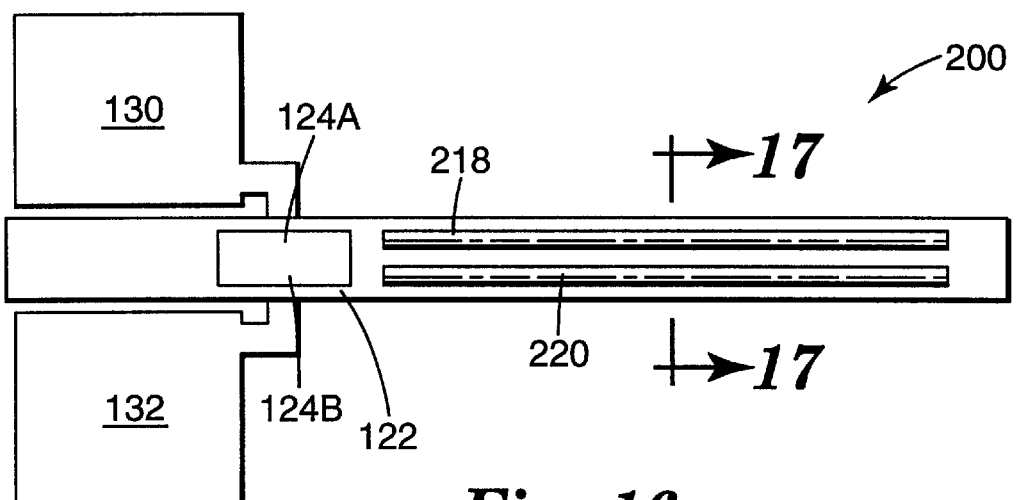
FIG. 16 is a top view of vertical thermal actuator with multiple reinforcing members in accordance with the present invention.
Figure 17:
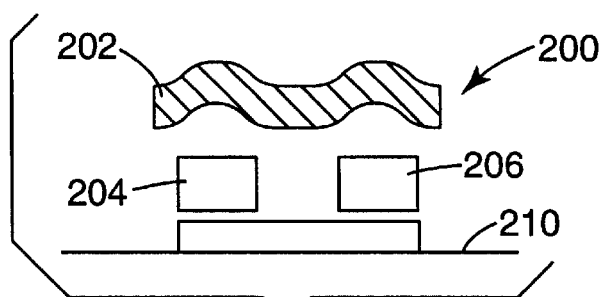
FIG. 17 is a section view of the vertical thermal actuator of FIG. 16.

FIGS. 16 and 17 illustrate a vertical thermal actuator 200 with a cold arm or upper beam 202 and two hot arms or beams 204, 206 in accordance with the present invention. The cold arm 202 extends from anchor 208 in a cantilever fashion above the hot arms 204, 206 and above the substrate 210 (see FIG. 17). The hot arms 204, 206 extend from anchors 205, 207. Alternatively, the hot arms 204, 206 may optionally extend from the anchor 208. Free ends 212, 214 of the hot arms 204, 206, respectively, are mechanically and electrically coupled at member 216.

A pair of reinforcing members 218, 220 extend along the cold arm 202 from distal end 222 to flexure 224. In the illustrated embodiment, the hot arms 204, 206 are located directly under the reinforcing members 218, 220, although the location of the hot arms 204, 206 relative to the cold arm 202 can vary. Any of the flexures and reinforcing members disclosed herein can be used in the vertical thermal actuator 200. The beam 204, 206 and the member 216 form a circuit. In one embodiment, the cold arm 202 is electrically isolated from the member 216. Alternatively, some or all of the current passing through the hot arms 204, 206 exits the vertical thermal actuator through the cold arm 202 or a grounding tab, as discussed herein.

Figure 18:
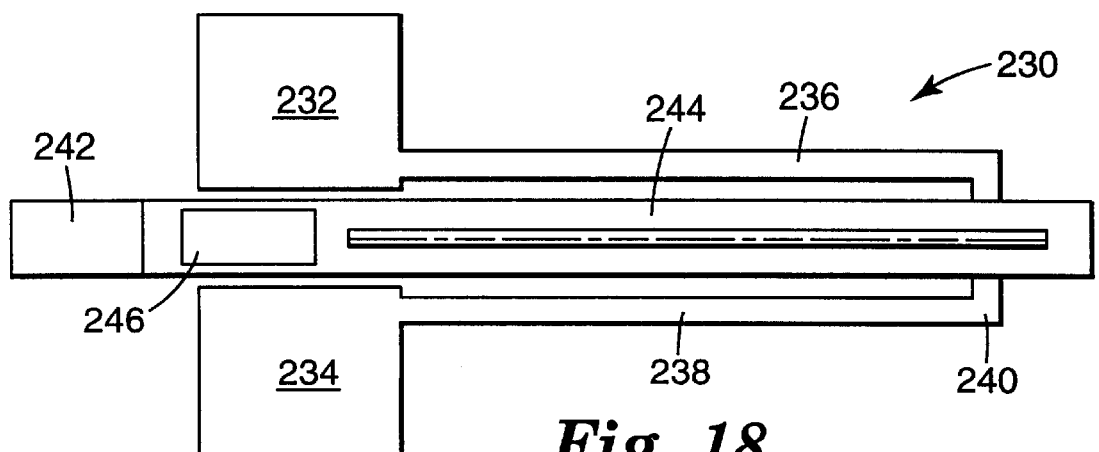
FIG. 18 is a top view of an alternate vertical thermal actuator in accordance with the present invention.

FIG. 18 illustrates an alternate vertical thermal actuator 230 having first and second anchors 232, 234 for the hot arms or beams 236, 238 located closer to the member 240 than the anchor 242 for the cold arm or beam 244. Flexure 246 can be located in front of, behind, or between the anchors 232, 234 relative to the member 240. In some embodiments, reinforcing member 248 may extend to between or behind the anchors 232, 234 relative to the member 240. The vertical thermal actuator 230 of FIG. 18 provides a greater displacement, with a reduction in total lifting force.

Figure 19:
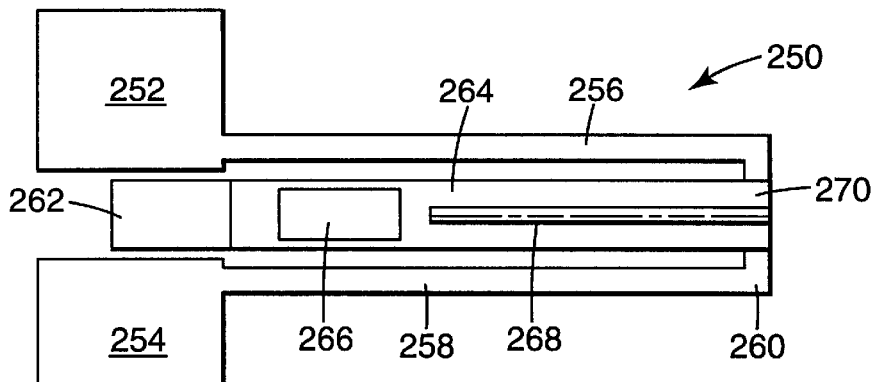
FIG. 19 is a top view of an alternate vertical thermal actuator in accordance with the present invention.

FIG. 19 illustrates an alternate vertical thermal actuator 250 having first and second anchors 252, 254 for the hot arms or beams 256, 258 located further from the member 260 than the anchor 262 for the cold arm or beam 264. The flexure 266 can be located between or in front of the anchors 252, 254 relative to the member 260. Reinforcing member 268 typically extends from the free end 270 to the flexure 266. In the embodiment of FIG. 19, the free end 270 does not extend past the member 260. This configuration minimizes bending at the tip and permits the vertical thermal actuator 250 to lift heavier loads.

Figure 20:
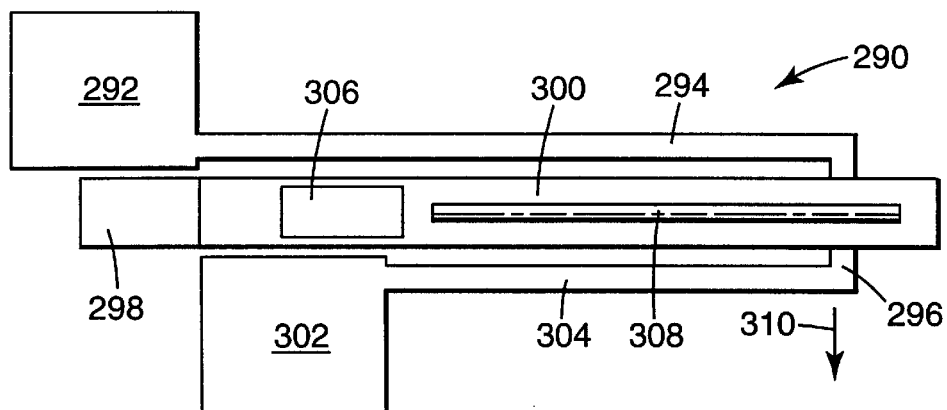
FIG. 20 is a top view of an alternate vertical thermal actuator in accordance with the present invention.

FIG. 20 illustrates an alternate vertical thermal actuator 290 having first anchor 292 for the hot arm or beam 294 further from the member 296 than the anchor 298 for the cold arm or beam 300. The second anchor 302 for the hot arm or beam 304 is located closer to the member 296 than the anchor 298. Flexure 306 can be located in front of, behind or between the anchors 292, 302. Reinforcing member 308 can extend up to or past anchor 302. In one embodiment, reinforcing member 308 can extend to anchor 292. The thermal expansion for the hot arms 294, 304 is still greater than any expansion of the cold arm 300 so that a net lifting force is generated when current is applied to the hot arms 294, 304. Assuming that the expansion per unit length is the same for the hot arms 294, 304, the net expansion of the hot arm 294 will be greater than the expansion of the hot arm 304. Consequently, the vertical thermal actuator 290 will rise from the substrate with a twisting motion, causing a lateral displacement of the member 296 in a direction 310. The degree of twist can be modified by changing the relative length of the hot arms 294, 304 and/or modifying the rigidity of the flexure 306.

Figure 21:
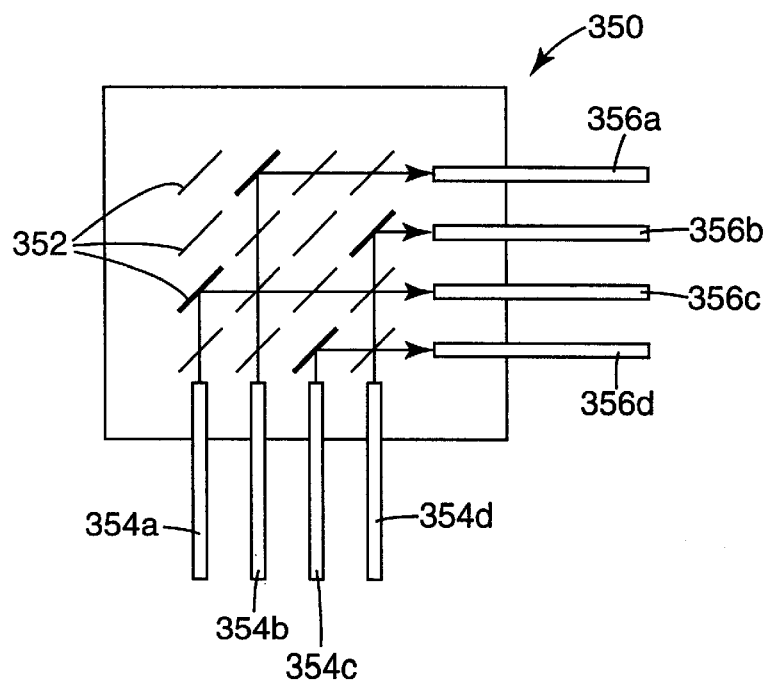
FIG. 21 is a schematic illustration of an optical switch in accordance with the present invention.

FIG. 21 is schematic illustration of an optical switch 350 utilizing a 4×4 array of optical devices 352. As used herein, "optical device" refers to reflectors, lenses, polarizing devices, wave guides, shutters, or occlusion devices. Each of the optical devices 352 is mechanically coupled to one or more vertical thermal actuators illustrated herein. In the in-plane position, the optical devices 352 do not extend into the optical path of input optical fibers 354a–354d. In the out-of-plane configuration the optical devices 352 extend into the optical path of the input optical fibers 354a–354d. The array of vertical mirrors 352 are arranged to permit an optical signal from any of the input fibers 354a–354d to be optically coupled with any of the output fibers 356a–356d through selective actuation of the vertical thermal actuators. The optical switch 350 illustrated in FIG. 21 is for illustration purposes only. The present vertical thermal actuators may be used in any of a variety of optical switch architectures, such as an on/off switch (optical gate), 2×2 switch, one x n switch, or a variety of other architectures. The optical device can be part of an optical communication system.

EXAMPLES

Example 1

An actuator substantially as illustrated in FIGS. 3–6 was fabricated on a silicon wafer by Cronos Integrated Microsystems of Research Triangle Park, North Carolina using the MUMPS process described in "MUMPs Design Handbook," revision 5.0 (2000).

The beams 68, 70 have lengths of about 161 micrometers and a cross section of about 2 micrometers×3 micrometers. The upper beam 84 has a length of about 175 micrometers and a cross section of about 11 micrometers by 2 micrometers. The flexure 87 as illustrated in FIG. 9, is a rectangular hole about 20 micrometers long and about 7 micrometers wide. The upper beam 84 has a length forward of the flexure 87 of about 155 micrometers.

Electrical leads were attached to the chip such that current could be applied through the actuator arms using a Model 6000 probe station available from Micromanipulator Company, Inc. of Carson City, Nev., which was operated using an amplified signal from an IBM compatible personal computer equipped with LabView software and PCI-6025E multifunction I/O board hardware available from National Instruments of Austin, Tex. Vertical deflection of the actuator tip as a function of current was determined using a Model FS-60 microscope available from Mitutoyo America Corporation of City of Industry, CA. The deflection for nine different activation currents is set forth in Table 1.

Examples 10–12

Opposing force measurements were carried out using a series of actuator devices in which a cantilever spring had been fabricated into the vertical thermal actuator described in Example 1. Deflection of the actuator caused the cantilever spring to be bent. Using spring constants of the cantilever spring opposing force values were calculated.

The results of samples 10–12 are set forth in Table 1. Under measurement conditions, no backbending of the actuator was observed. At current flows above about 4.5 mA backbending of the actuator was observed.

TABLE 1

Actuator Tip Deflection vs. Applied Current

| Example No. | Current (milliamperes) | Opposing Force (micro-Newtons) | Average Deflection (micrometers) | St Dev (micrometers) |
|---|---|---|---|---|
| 1 | 2.0 | 0 | 2.3 | 1.0 |
| 2 | 2.25 | 0 | 3 | 0.0 |
| 3 | 2.5 | 0 | 4.4 | 0.5 |
| 4 | 2.75 | 0 | 5.5 | 0.7 |
| 5 | 3.0 | 0 | 7.0 | 1.0 |
| 6 | 3.25 | 0 | 8.0 | 1.4 |
| 7 | 3.5 | 0 | 11.0 | 0.7 |
| 8 | 3.75 | 0 | 12.0 | 0.0 |
| 9 | 4.0 | 0 | 16.5 | 0.6 |
| 10 | 3.5 | 0.17 | 4.75 | 0.03 |
| 11 | 3.5 | 0.87 | 2.86 | 0.16 |
| 12 | 3.5 | 1.33 | 2.25 | 0.62 |

All of the patents and patent applications disclosed herein, including those set forth in the Background of the Invention, are hereby incorporated by reference. Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention. For example, any of the flexures, reinforcing structures, anchor locations and beam configurations disclosed herein can be combined to produce numerous vertical thermal actuators.

What is claimed is:

1. A vertical thermal actuator constructed on a surface of a substrate comprising:
   at least one hot arm having a first end anchored to the surface and a free end located above the surface;
   a grounding tab electrically coupling the hot arm to the substrate;
   a cold arm having a first end anchored to the surface and a free end, the cold arm being located above the hot arm relative to the surface;
   a flexure formed in the cold arm near the first end thereof adapted to provide controlled bending; and
   a member mechanically and electrically coupling the free ends of the hot and cold arms such that the actuator bends generally at the flexure so that the member moves away from the substrate when current is applied to at least the hot arm.

2. The apparatus of claim 1 wherein the flexure comprises at least one of a recess, depression, cut-out, hole, location of narrowed, thinned or weakened material, alternate material or other structural features or material change that decreases resistance to bending in that location.

3. The apparatus of claim 1 wherein the cold arm is electrically isolated from the hot arm.

4. The apparatus of claim 1 wherein the cold arm is located directly over the hot arm.

5. The apparatus of claim 1 wherein the first end of the hot arm is attached to the substrate adjacent to the first end of the cold arm.

6. The apparatus of claim 1 wherein the first end of the hot arm is attached to the substrate offset to the first end of the cold arm.

7. The apparatus of claim 1 comprising a metal layer extending along the cold arm.

8. The apparatus of claim 1 wherein at least one hot arm comprises two hot arms each having a first end anchored to the surface and free ends located above the surface.

9. The apparatus of claim 1 comprising a plurality of vertical thermal actuators on the substrate.

10. The apparatus of claim 1 comprising at least one optical device mechanically coupled to the vertical thermal actuator.

11. The apparatus of claim 10 wherein the optical device comprises one of a reflector, a lens, a polarizer, a wave guide, a shutter, or an occluding structure.

12. The apparatus of claim 10 comprising an optical communication system including at least one optical device.

13. A vertical thermal actuator constructed on a surface of a substrate comprising:
   at least one hot arm having a first end anchored to the surface and a free end located above the surface;
   a grounding tab electrically coupling the hot arm to the substrate;
   a cold arm having a first end anchored to the surface and a free end, the cold arm being located above the hot arm relative to the surface;
   a reinforcing member formed along a first portion of the cold arm, a second portion of the cold arm without the reinforcing member adapted to provide controlled bending; and
   a member mechanically and electrically coupling the free ends of the hot and cold arms such that the member moves away from the substrate when current is applied to the hot arm.

14. The apparatus of claim 13 comprising a flexure formed in the second portion of the cold beam without the reinforcing member.

15. The apparatus of claim 13 wherein the cold arm is electrically isolated from the hot arm.

16. A vertical thermal actuator constructed on a surface of a substrate comprising:
   a first beam having a first end anchored to the surface and a free end located above the surface;
   a second beam having a first end anchored to the surface and a free end located above the surface;
   a grounding tab electrically coupling the first and second beams to the substrate;
   a member electrically and mechanically coupling the free end of the first beam to the free end of the second beam;
   a third beam having a first end anchored to the surface and a free end mechanically coupled to the member, the third beam being located above the first and second beams relative to the surface;
   a flexure formed in the third beam near the first end thereof adapted to provide controlled bending; and
   first and second electrical contacts electrically coupled to the first ends of the first and second beams, respectively, such that current supplied to the first and second contacts causes the first and second beams to thermally expand and the member to move in an arc away from the substrate.

17. The apparatus of claim 16 wherein the first and second beams comprise a circuit through which electric current is passed.

18. The apparatus of claim 16 comprising a reinforcing member formed in the third beam.

19. The apparatus of claim 18 wherein the reinforcing member extends from proximate the flexure to proximate the free end thereof.

20. The apparatus of claim 18 wherein the reinforcing member is integrally formed in the third beam.

21. The apparatus of claim 18 wherein the reinforcing member extends longitudinally along the third beam.

22. The apparatus of claim 16 wherein the third beam is located generally over the first and second beams.

23. The apparatus of claim 16 comprising a metal layer extending along the second beam.

24. The apparatus of claim 16 wherein the first ends of the first, second and third beams are adjacent.

25. The apparatus of claim 16 wherein the first ends of the first and second beams are closer to the member than the first end of the third beam.

26. The apparatus of claim 16 wherein the first ends of the first and second beams are farther from the member than the first end of the third beam.

27. The apparatus of claim 16 wherein the first end of the first beam is closer to the member than the first end of the third beam and the first end of the second beam is farther from the member than the first end of the third beam.

28. The apparatus of claim 16 wherein the first end of the third beam is electrically isolated from the substrate.

29. The apparatus of claim 16 wherein the first and second beams are generally parallel to the first surface in an unactivated configuration.

30. The apparatus of claim 16 wherein the first and second beams comprise polysilicon.

31. The apparatus of claim 16 comprising a metal layer extending along at least one of the first, second and third beams.

32. The apparatus of claim 16 wherein the first and second beams are at an acute angle with respect to the surface in an activated configuration.

33. The apparatus of claim 16 wherein the third beam is generally parallel to the surface in an unactivated configuration.

34. The apparatus of claim 16 comprising a plurality of vertical thermal actuators constructed on the substrate.

35. The apparatus of claim 16 comprising at least one optical device mechanically coupled to the vertical thermal actuator.

36. The apparatus of claim 35 wherein the optical device comprises one of a reflector, a lens, a polarizer, a wave guide, a shutter, or an occluding structure.

37. The apparatus of claim 35 comprising an optical communication system including at least one optical device.

38. A vertical thermal actuator constructed on a surface of a substrate comprising:
   a first beam having a first end anchored to the surface and a free end located above the surface;
   a second beam having a first end anchored to the surface and a free end located above the surface;
   a grounding tab electrically coupling the first and second beams to the substrate;
   a member electrically and mechanically coupling the free end of the first beam to the free end of the second beam;
   a third beam having a first end anchored to the surface and a free end mechanically coupled to the member, the third beam being located above the first and second beams relative to the surface;
   a reinforcing member formed in a first portion of the third beam, a second portion of the third beam without the reinforcing member adapted to provide the vertical thermal actuator with controlled bending; and
   first and second electrical contacts electrically coupled to the first ends of the first and second beams, respectively, such that current supplied to the first and second contacts causes the first and second beams to thermally expand and the member to move in an arc away from the substrate.

39. The apparatus of claim 38 comprising a flexure formed in the second portion of the third beam.

40. A vertical thermal actuator constructed on a surface of a substrate comprising:
- at least one hot arm having a first end anchored to the surface and a free end located above the surface;
- a cold arm having a first end anchored to the surface and a free end, the cold arm being located above the hot arm relative to the surface;
- a flexure formed in the cold arm near the first end thereof adapted to provide controlled bending, wherein the hot arm and the cold arm comprise a circuit through which electric current is passed; and
- a member mechanically and electrically coupling the free ends of the hot and cold arms such that the actuator bends generally at the flexure so that the member moves away from the substrate when current is applied to at least the hot arm.

41. The apparatus of claim 40 wherein the flexure comprises at least one of a recess, depression, cut-out, hole, location of narrowed, thinned or weakened material, alternate material or other structural features or material change that decreases resistance to bending in that location.

42. A vertical thermal actuator constructed on a surface of a substrate comprising:
- at least one hot arm having a first end anchored to the surface and a free end located above the surface;
- a cold arm having a first end anchored to the surface and a free end, and a reinforcing member formed in the cold arm comprising one or more ridges extending longitudinally along the cold arm, the cold arm being located above the hot arm relative to the surface;
- a flexure formed in the cold arm near the first end thereof adapted to provide controlled bending; and
- a member mechanically and electrically coupling the free ends of the hot and cold arms such that the actuator bends generally at the flexure so that the member moves away from the substrate when current is applied to at least the hot arm.

43. The apparatus of claim 42 wherein the reinforcing member extends from proximate the flexure to proximate the free end thereof.

44. The apparatus of claim 42 wherein the reinforcing member is integrally formed in the cold arm.

45. The apparatus of claim 42 wherein the reinforcing member extends longitudinally along the cold arm.

46. The apparatus of claim 42 wherein the reinforcing member is located directly above the hot arm.

47. A vertical thermal actuator constructed on a surface of a substrate comprising:
- at least one hot arm having a first end anchored to the surface and a free end located above the surface;
- a cold arm having a first end anchored to the surface and a free end, the cold arm being located above the hot arm relative to the surface, wherein the hot arm and the cold arm comprise a circuit through which electric current is passed;
- a reinforcing member formed along a first portion of the cold arm, a second portion of the cold arm without the reinforcing member adapted to provide controlled bending; and
- a member mechanically and electrically coupling the free ends of the hot and cold arms such that the member moves away from the substrate when current is applied to the hot arm.

48. The apparatus of claim 47 wherein the reinforcing member comprises one or more ridges extending longitudinally along the first portion of the third beam.

49. A vertical thermal actuator constructed on a surface of a substrate comprising:
- at least one hot arm having a first end anchored to the surface and a free end located above the surface;
- a cold arm having a first end anchored to the surface and a free end, the cold arm being located above the hot arm relative to the surface;
- a reinforcing member formed along a first portion of the cold arm and comprising one or more ridges extending longitudinally along the first portion of the cold arm, a second portion of the cold arm without the reinforcing member adapted to provide controlled bending; and
- a member mechanically and electrically coupling the free ends of the hot and cold arms such that the member moves away from the substrate when current is applied to the hot arm.

50. The apparatus of claim 49 comprising a flexure formed in the second portion of the third beam.

51. A vertical thermal actuator constructed on a surface of a substrate comprising:
- a first beam having a first end anchored to the surface and a free end located above the surface;
- a second beam having a first end anchored to the surface and a free end located above the surface;
- a member electrically and mechanically coupling the free end of the first beam to the free end of the second beam;
- a third beam having a first end anchored to the surface and a free end mechanically coupled to the, the third beam being located above the first and second beams relative to the surface;
- a reinforcing member in the third beam, wherein the reinforcing member comprises one or more ridges extending longitudinally along the third beam;
- a flexure formed in the third beam near the first end thereof adapted to provide controlled bending; and
- first and second electrical contacts electrically coupled to the first ends of the first and second beams, respectively, such that current supplied to the first and second contacts causes the first and second beams to thermally expand and the member to move in an arc away from the substrate.

52. A vertical thermal actuator constructed on a surface of a substrate comprising:
- a first beam having a first end anchored to the surface and a free end located above the surface;
- a second beam having a first end anchored to the surface and a free end located above the surface;
- a member electrically and mechanically coupling the free end of the first beam to the free end of the second beam;
- a third beam having a first end anchored to the surface and a free end mechanically coupled to the member, the third beam being located above the first and second beams relative to the surface;
- a reinforcing member formed in a first portion of the third beam, a second portion of the third beam without the reinforcing member adapted to provide the vertical thermal actuator with controlled bending, wherein the reinforcing member comprises one or more ridges extending longitudinally along the third beam; and
- first and second electrical contacts electrically coupled to the first ends of the first and second beams, respectively, such that current supplied to the first and second contacts causes the first and second beams to thermally expand and the member to move in an arc away from the substrate.

* * * * *